United States Patent
Lin et al.

(10) Patent No.: US 8,633,403 B2
(45) Date of Patent: Jan. 21, 2014

(54) METHODS AND APPARATUS FOR SHIELDING CIRCUITRY FROM INTERFERENCE

(75) Inventors: Gloria Lin, San Ramon, CA (US); Wyeman Chen, Hayward, CA (US); Michael Nikkhoo, Saratoga, CA (US); Michael Rosenblatt, Campbell, CA (US); Hammid Mahammadinia, San Jose, CA (US); Ziv Wolkowicki, Valley Stream, NY (US); Amir Salehi, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/270,421

(22) Filed: Oct. 11, 2011

(65) Prior Publication Data

US 2012/0024588 A1 Feb. 2, 2012

Related U.S. Application Data

(63) Continuation of application No. 12/397,922, filed on Mar. 4, 2009, now Pat. No. 8,071,893.

(51) Int. Cl.
*H05K 9/00* (2006.01)

(52) U.S. Cl.
USPC .......................... 174/386; 174/387; 361/818

(58) Field of Classification Search
USPC ............... 174/377, 384, 386, 387; 361/818
See application file for complete search history.

(56) References Cited

U.S. PATENT DOCUMENTS

| | | | |
|---|---|---|---|
| 5,386,342 A | 1/1995 | Rostoker | |
| 5,639,989 A | 6/1997 | Higgins, III | |
| 5,900,581 A | 5/1999 | Ootake | |
| 5,962,810 A | 10/1999 | Glenn | |
| 6,072,122 A | 6/2000 | Hosoya | |
| 6,418,030 B1 | 7/2002 | Yamaguchi et al. | |
| 6,472,598 B1 | 10/2002 | Glenn | |
| 6,549,426 B1 * | 4/2003 | Lawlyes et al. | 361/816 |
| 6,815,263 B2 | 11/2004 | Rissing et al. | |
| 7,041,532 B2 | 5/2006 | Grigg | |
| 2001/0033478 A1 | 10/2001 | Ortiz et al. | |
| 2002/0060084 A1 | 5/2002 | Hilton et al. | |
| 2002/0189834 A1 | 12/2002 | Goetschalckx | |
| 2004/0231872 A1 | 11/2004 | Arnold et al. | |
| 2005/0130397 A1 | 6/2005 | Bentley et al. | |
| 2005/0277231 A1 | 12/2005 | Hembree et al. | |
| 2007/0231970 A1 | 10/2007 | Fukuo et al. | |

FOREIGN PATENT DOCUMENTS

WO 2006/017484 2/2006

* cited by examiner

*Primary Examiner* — Hung Ngo
(74) *Attorney, Agent, or Firm* — Chih-Yun Wu

(57) ABSTRACT

This is directed to methods and apparatus for shielding a circuitry region of an electronic device from interference (e.g., EMI). A conductive dam may be formed about a periphery of the circuitry region. A non-conductive or electrically insulating fill may then be applied to the circuitry region within the dam. Next, a conductive cover may be applied above the fill. The cover may be electrically coupled to the dam. The dam may include two or more layers of conductive material stacked on top of one another. In some embodiments, the conductive cover may be pad printed or screen printed above the fill. In other embodiments, the conductive cover may be a conductive tablet that is melted above the fill.

22 Claims, 8 Drawing Sheets

METHODS AND APPARATUS FOR SHIELDING CIRCUITRY FROM INTERFERENCE

CROSS-REFERENCE TO RELATED APPLICATIONS

This application is a continuation of U.S. patent application Ser. No. 12/397,922, filed Mar. 4, 2009, which is hereby incorporated by reference.

FIELD OF THE INVENTION

This can relate to methods and apparatus for shielding circuitry from interference.

BACKGROUND OF THE DISCLOSURE

Electromagnetic interference ("EMI") and radio frequency interference ("RFI") are two of the various types of unwanted disturbances that may interrupt, obstruct, or otherwise affect or limit the effective performance of electronic circuitry due to electromagnetic conduction or electromagnetic radiation from an external source. A traditional way to reduce such interference for electronic circuitry is to place electrically conducting metal around the circuitry. For example, several electronic circuit components are sometimes placed under a metal cover or inside a metal container or can. A layer of electrical insulation is sometimes included between the circuit components and the metal shielding to ensure that the shielding does not cause any short circuits in the electronic circuitry by making electrical contact with that circuitry.

This metal shielding is typically fabricated in advance with a predetermined size and shape that is retained after the shielding has been combined with the electronic circuitry to be shielded. Therefore, the shielding is generally made significantly larger than the theoretical minimum size the shielding could have had, because of manufacturing tolerances for (1) the electronic circuitry, (2) the shielding, and (3) any insulation used between the circuitry and the shielding.

SUMMARY OF THE DISCLOSURE

Methods and apparatus for shielding circuitry from interference are provided.

A conductive dam may be formed about the periphery of a circuitry region to be shielded. A non-conductive or electrically insulating fill may then be applied to the circuitry region within the dam. Next, a conductive cover may be applied above the fill. The cover may be electrically coupled to the dam.

According to some embodiments, the dam may include two or more layers of conductive epoxy stacked on top of one another. The circuitry region may be coupled to a top surface of a circuit board and the dam may also be coupled to the top surface of the circuit board about the circuitry region. According to some embodiments, the conductive cover may be pad printed or screen printed above the fill. According to other embodiments, the conductive cover may be a conductive tablet that is melted above the fill.

BRIEF DESCRIPTION OF THE DRAWINGS

The above and other aspects of the invention, its nature, and various features will become more apparent upon consideration of the following detailed description, taken in conjunction with the accompanying drawings, in which like reference characters refer to like parts throughout, and in which.

DETAILED DESCRIPTION OF THE DISCLOSURE

Methods and apparatus for shielding circuitry from interference are provided and described with reference to FIGS. 1-8.

FIGS. 1-7 show various portions of an exemplary electronic device 10 in various stages of manufacture that includes at least one shielded electronic component 20 coupled to at least one circuit board 90. The term "electronic device" can include, but is not limited to, music players, video players, still image players, game players, other media players, music recorders, video recorders, cameras, other media recorders, radios, medical equipment, domestic appliances, transportation vehicle instruments, musical instruments, calculators, cellular telephones, other wireless communication devices, personal digital assistants, remote controls, pagers, computers (e.g., desktops, laptops, tablets, servers, etc.), monitors, televisions, stereo equipment, set up boxes, set-top boxes, boom boxes, modems, routers, keyboards, mice, speakers, printers, and combinations thereof.

Figure 1:
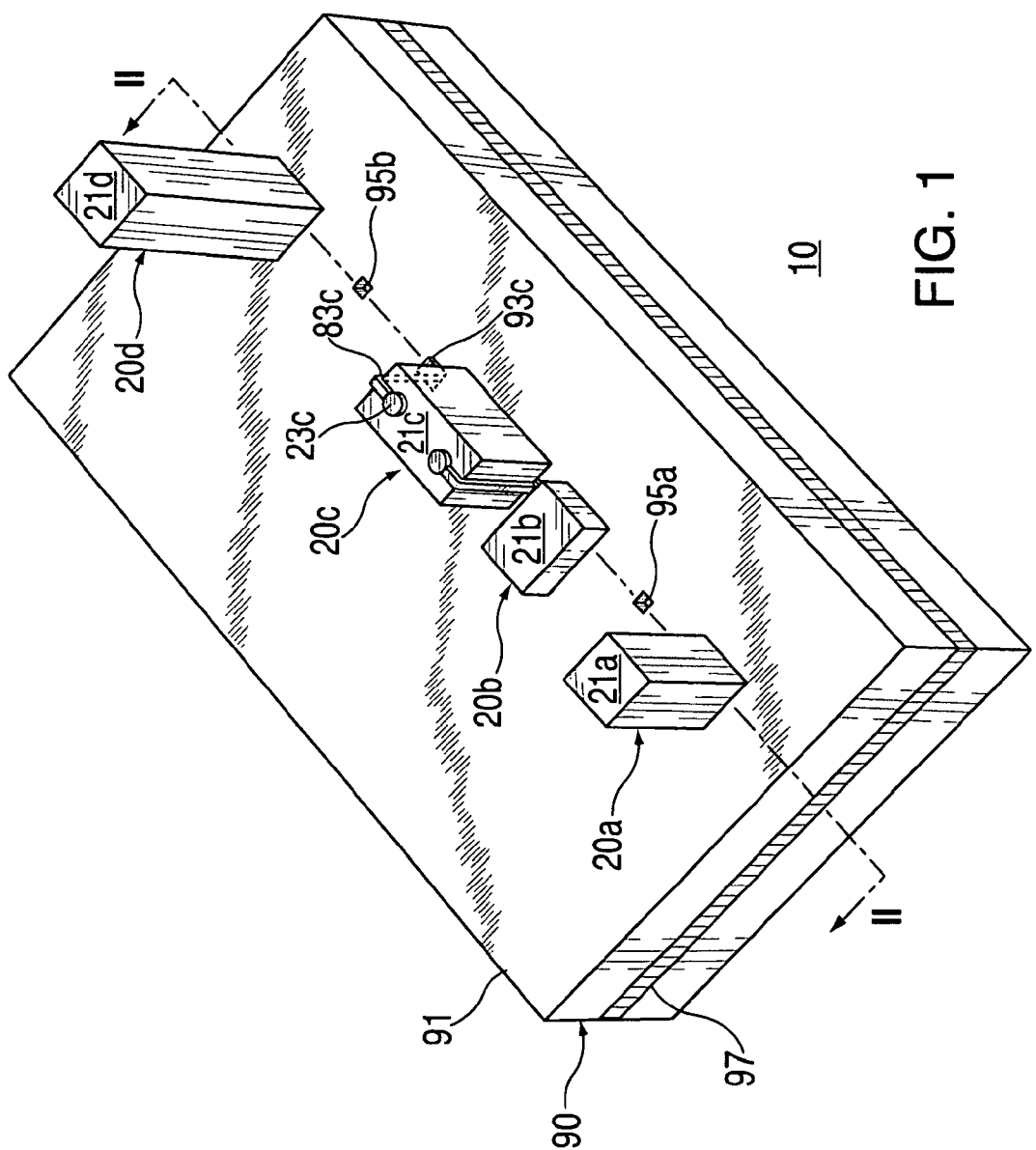
FIG. 1 is a top, front, left perspective view of a portion of an electronic device to be shielded in accordance with some embodiments of the invention.

As shown in FIG. 1, for example, electronic device 10 may include circuit board 90 and multiple electronic components 20 (e.g., electronic components 20a-20d). Circuit board 90 may be a central or primary printed circuit board ("PCB") of electronic device 10, and may also be known as a main circuit board, motherboard, mainboard, baseboard, system board, planar board, or logic board. Circuit board 90 may provide one or more attachment points to each one of electronic components 20 of electronic device 10. Generally, most of the basic circuitry and components required for electronic device 10 to function may be onboard or coupled (e.g., via one or more cables, bond pads, leads, terminals, cables, wires, contact regions, etc.) to circuit board 90. For example, electronic components 20 may be mounted or otherwise coupled to top surface 91 of circuit board 90. Such electronic components 20 may include one or more chipsets or specialized groups of integrated circuits. For example, circuit board 90 may include two components or chips, such as a Northbridge and Southbridge. Although in other embodiments, these chips may be combined into a single component. Each one of electronic components 20 can also be one of various other types of components, including, but not limited to, a processor, memory, power supply, communications circuitry, input component, output component, and combinations thereof.

Figure 2:
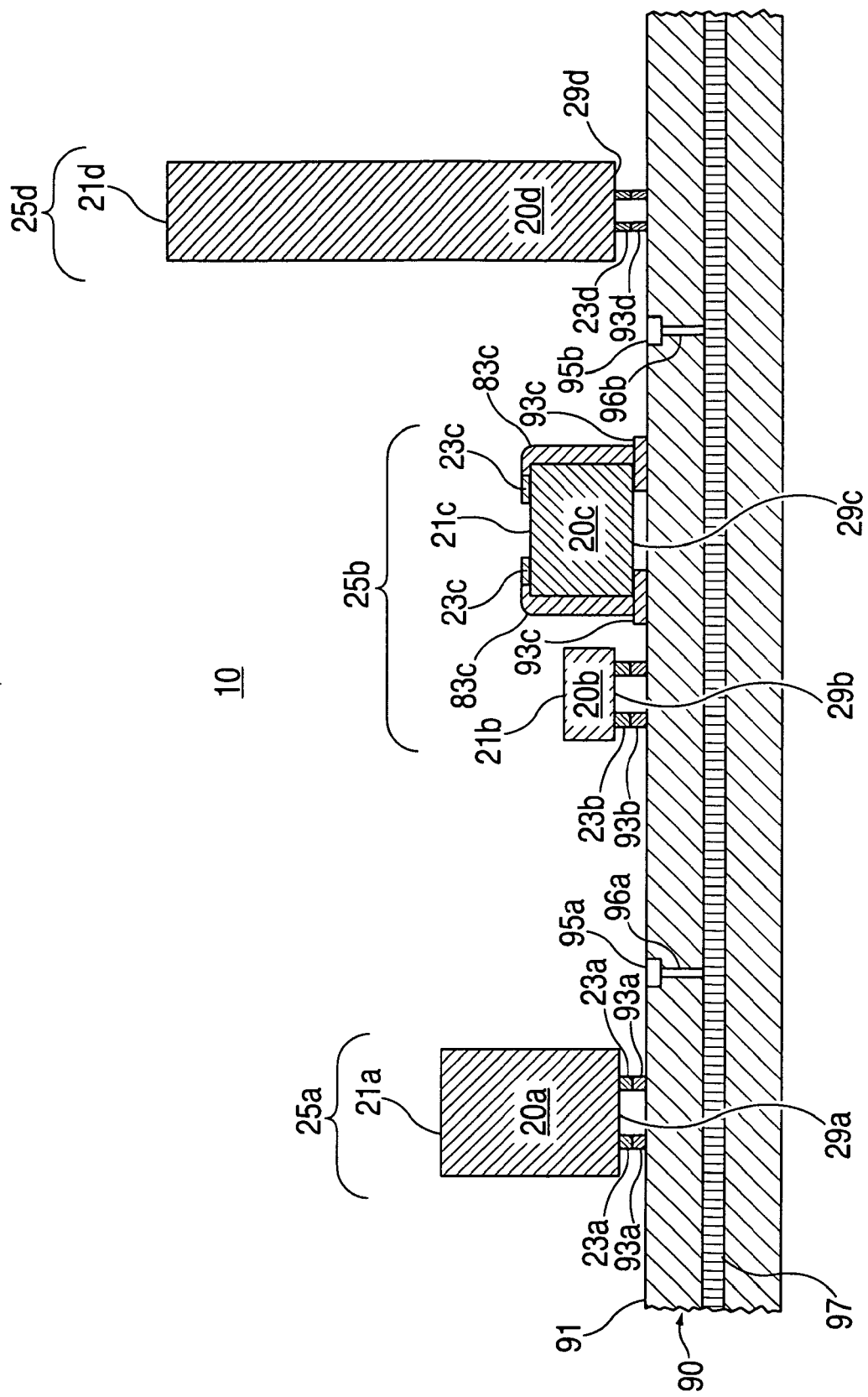
FIG. 2 is a partial cross-sectional view of the portion of the electronic device of FIG. 1, taken from line II-II of FIG. 1.

As shown in FIGS. 1 and 2, for example, each one of electronic components 20 may include a top surface 21, a bottom surface 29, and one or more terminals or bond pads or other component contact regions 23 coupled to circuitry (not shown) of electronic component 20. Each component contact region 23 of each electronic component 20 may also be electrically coupled to a respective terminal, bond pad, or other type of board contact region 93 of circuit board 90. Each one of board contact regions 93 may be coupled to one or more signal planes, vias, or other circuitry (not shown) of circuit board 90.

For example, as shown in FIG. 2, electronic component 20a may include two component contact regions 23a on bottom surface 29a of electronic component 20a. Each component contact region 23a may be coupled to a respective board contact region 93a of circuit board 90, which may be on top surface 91 of circuit board 90, for example. Component contact region 23a and board contact region 93a may be directly coupled to one another. As another example, as shown in FIG. 2, electronic component 20c may include two component contact regions 23c on top surface 21c of electronic component 20c. Each component contact region 23c may be coupled to a respective board contact region 93c of circuit board 90 via a respective wire 83c.

Moreover, circuit board 90 may include one or more ground or common voltage contact regions 95. Each common voltage contact region 95 may, for example, be provided on top surface 91 of circuit board 90. As shown in FIG. 2, for example, each common voltage contact region 95 may be electrically coupled to a ground or common voltage plane 97 of circuit board 90 through a respective via 96. It is to be understood that these component contact regions 23, board contact regions 93, and common voltage contact regions 95 may each have any of a variety of shapes, sizes, and locations relative to the remainder of the associated electronic component 20 or circuit board 90.

Figure 4:
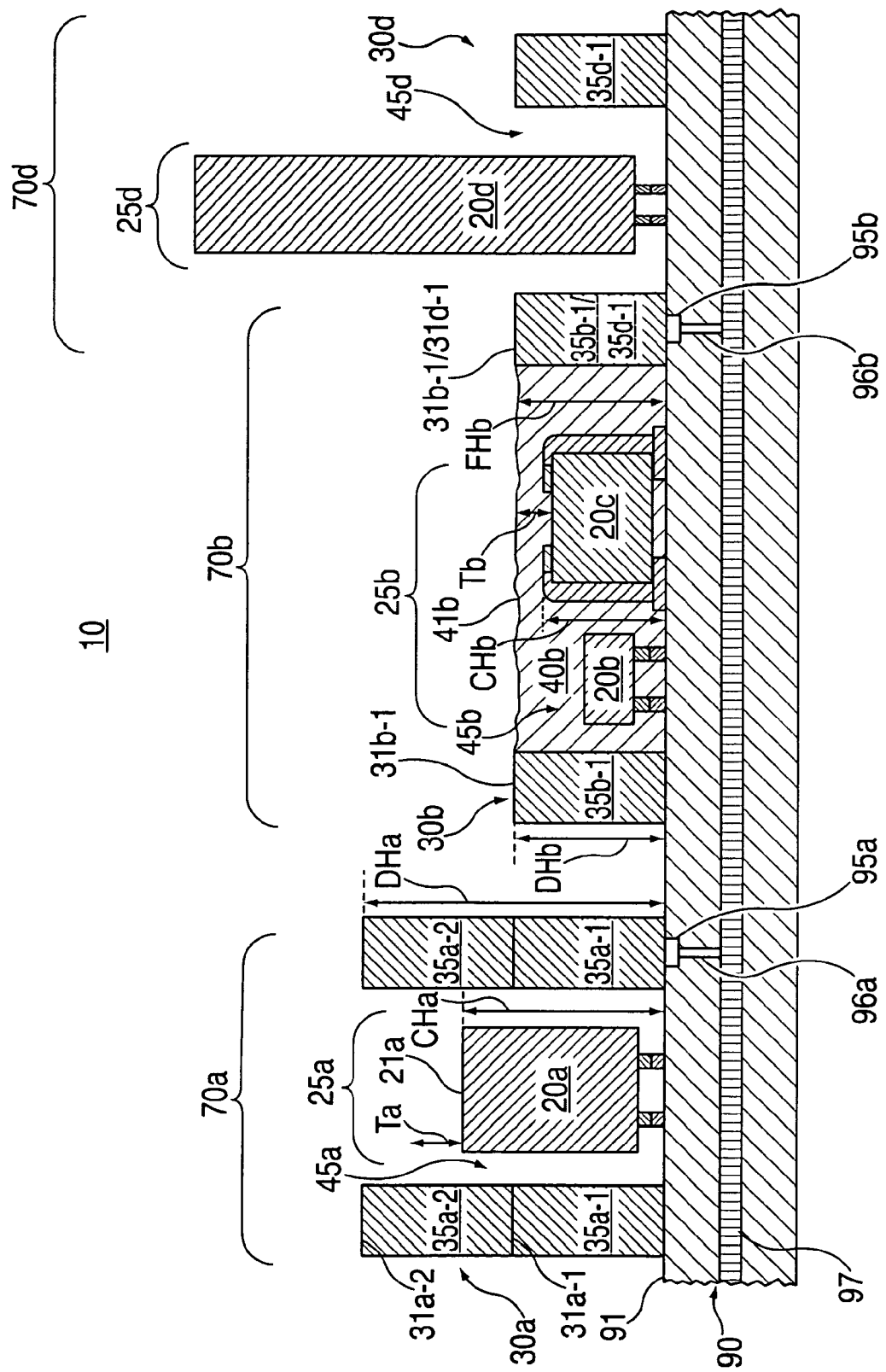
Figure 5:
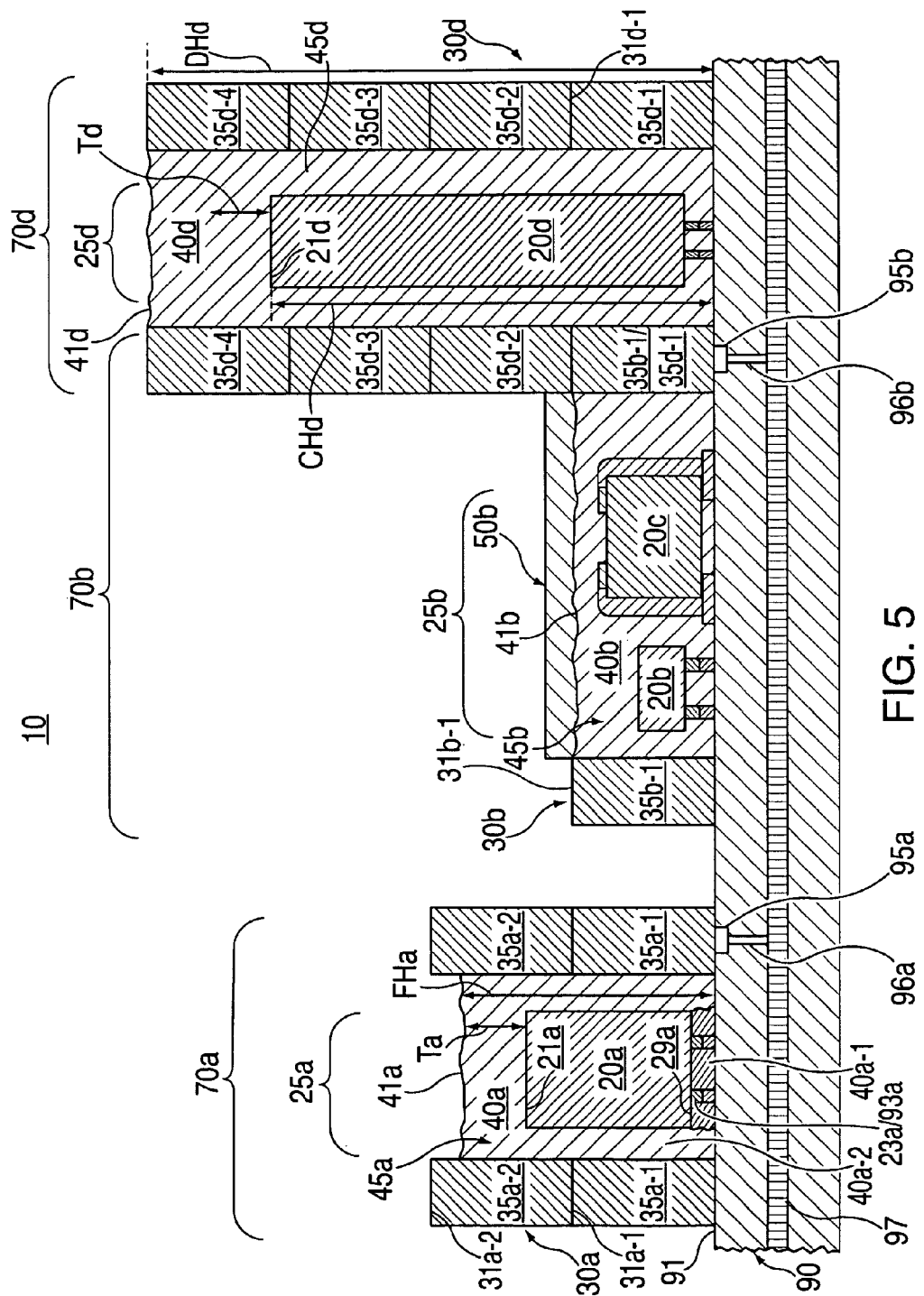
Figure 6:
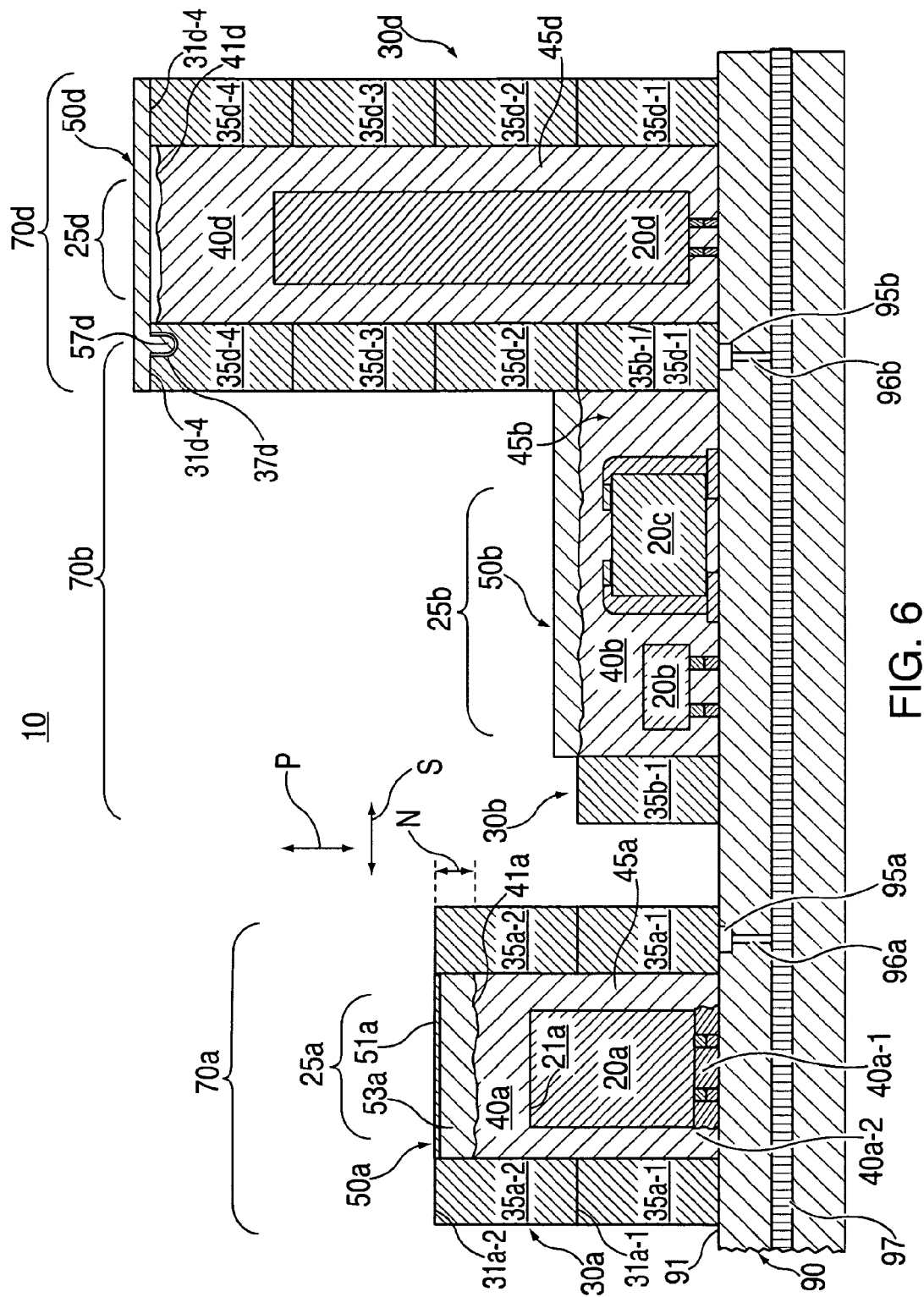

FIGS. 3-7 illustrate shield assemblies of electronic device 10 in various stages of manufacture. Electronic device 10 may include one or more shield assemblies 70 (e.g., shields 70a, 70b, and 70d). Each shield 70 may protect a circuitry region 25 from interference, and each circuitry region 25 may include one or more electronic components 20. For example, as shown in FIG. 6, circuitry region 25a may include electronic component 20a protected by shield 70a, circuitry region 25b may include electronic components 20b and 20c protected by shield 70b, while circuitry region 25d may include electronic component 20d protected by shield 70d. Each shield 70 may include at least one dam 30, at least one fill 40, and at least one cover 50. Each dam 30 may be provided about the periphery of a circuitry region 25 to be shielded. Fill 40 may be applied to circuitry region 25 within a pocket 45 defined by dam 30. Cover 50 may be provided above fill 40.

According to some embodiments, each dam 30 may include two or more layers 35 of conductive epoxy or any other suitable conductive material stacked on top of one another. Dam 30 may be coupled to top surface 91 of circuit board 90 about electronic components 20 to be shielded. According to some embodiments, cover 50 may be conductive and may be electrically coupled to dam 30. Cover 50 may be pad printed or screen printed above fill 40. According to other embodiments, cover 50 may include a conductive tablet that is melted above fill 40.

Figure 3:
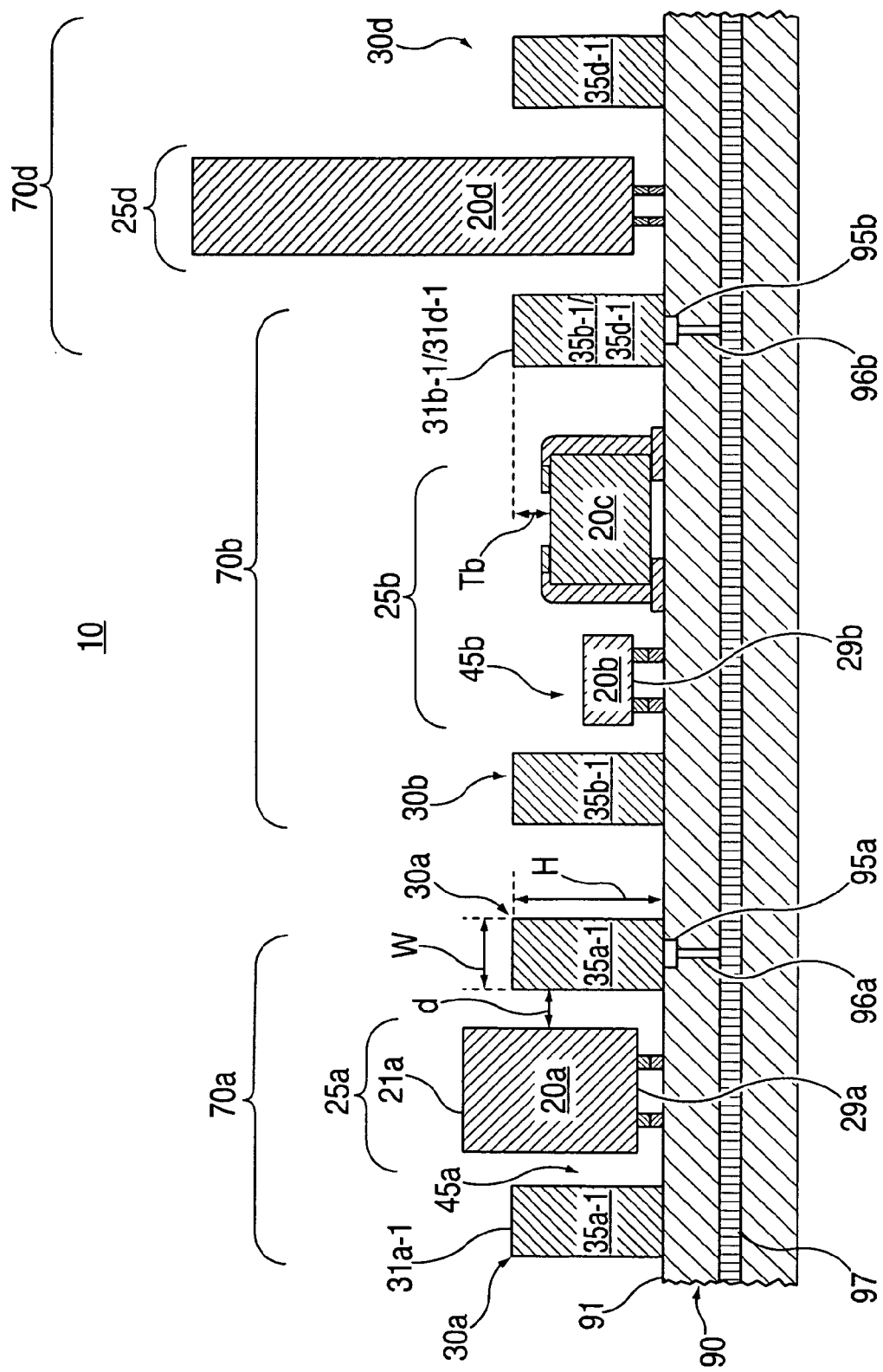
FIGS. 3-6 are partial cross-sectional views, similar to FIG. 2, of the portion of the electronic device of FIGS. 1 and 2, along with shields in various stages of manufacture, in accordance with some embodiments of the invention.

As shown in FIG. 3, a shield 70a may include a dam 30a that may be provided about the periphery of circuitry region 25a. Dam 30a may include at least a first dam layer 35a-1. First dam layer 35a-1 of shield 70a may be formed on top surface 91 of circuit board 90 and may circumscribe at least bottom surface 29a of electronic component 20a. Dam 30a may be electrically coupled to common voltage contact region 95a of circuit board 90. For example, as shown in FIG. 3, a portion of first dam layer 35a-1 may be disposed on top of common voltage contact region 95a. However, in other embodiments, dam 30a may be electrically coupled to common voltage contact region 95a in various other ways, such as via a wire (not shown) coupled to both common voltage contact region 95a and a dam layer 35a.

Dam 30a and top surface 91 of circuit board 90 may together define space or pocket 45a about electronic components 20 of circuitry region 25a (i.e., electronic component 20a). Dam 30a may include only first dam layer 35a-1 or a stack of two or more dam layers 35a to define pocket 45a. Dam 30a may be sized such that pocket 45a is able to hold enough fill material to submerge each electronic component 20 of circuitry region 25a within pocket 45a. The volume of pocket 45a may be at least partially based on the height of dam 30a, and thus on the number of dam layers 35a included in dam 30a.

In some embodiments, dam 30a of shield 70a may include at least one additional layer 35a. Each additional dam layer 35a may be applied about the periphery of circuitry region 25a. As shown in FIG. 4, for example, a second dam layer 35a-2 of dam 30a may be provided on top surface 31a-1 of first dam layer 35a-1 and may circumscribe at least a portion of electronic component 20a. Even more additional dam layers 35a may be added to dam 30a as needed. Dam 30a may circumscribe each component 20 of circuitry region 25a as well as each component contact region 23a and board contact region 93a associated with each electronic component 20 of circuitry region 25a.

Each dam layer 35 may be formed of any suitable material for providing dam 30 that can define a pocket 45 about a circuitry region to be shielded. For example, each dam layer 35 may be any suitable electrically conductive adhesive or epoxy. Each dam layer 35 may be applied in any suitable way, such as by extruding the electrically conductive material through a carbide auger dispenser, onto circuit board 90 around the perimeter of circuitry region 25.

As shown in FIG. 3, for example, each dam layer 35 may be provided to have a dam layer height H and a dam layer width W. In some embodiments, height H may be in the range of 0.1 millimeters to 0.5 millimeters. In some embodiments, height H may be in the range of 0.2 millimeters to 0.4 millimeters. In some embodiments, height H may be about 0.3 millimeters. Of course, height H of dam layer 35a can be widely varied and is not limited to these examples. For example, height H can be greater than 0.5 millimeters. In some embodiments, width W may be in the range of 0.1 millimeters to 0.5 millimeters. In some embodiments, width W may be in the range of 0.2 millimeters to 0.4 millimeters. In some embodiments, width W may be about 0.3 millimeters. Of course, width W of dam layer 35a can be widely varied and is not limited to these examples. For example, width W can be greater than 0.5 millimeters.

Moreover, as shown in FIG. 3, for example, each dam layer 35a may be positioned a distance d from electronic components 20 of an associated circuitry region 25. In some embodiments, distance d may be in the range of 0.05 millimeters to 0.35 millimeters. In some embodiments, distance d may be in the range of 0.15 millimeters to 0.25 millimeters. In some embodiments, distance d may be about 0.20 millimeters. Of course, distance d between dam layer 35 and circuitry region 25 can be widely varied and is not limited to these examples. For example, distance d can be less than 0.05 millimeters.

Each additional dam layer 35 may be extruded or otherwise applied on top of the previous dam layer 35. The geometry of each dam layer 35 (e.g., dam height H and dam width W of each dam layer 35) may be chosen based on various factors, such as the final height of dam 30, the conductive materials of dam layers 35, the electronic components 20 of circuitry region 25 being shielded, and the like. In some embodiments, five or more (e.g., eight) dam layers 35 may be stacked on top of one another, each having substantially the same dam height H and dam width W. As shown in FIG. 4, for example, dam 30 may have a total dam height DH (e.g., combined dam height H of every dam layer 35 in dam 30). Total dam height DH may be chosen based on various factors, such as the conductive materials of dam layers 35, the electronic components 20 of circuitry region 25 being shielded, and the like. In some embodiments, total dam height DH may be in the range of 1.3 millimeters to 1.9 millimeters. In some embodiments, total dam height DH may be in the range of 1.5 millimeters to 1.7 millimeters. In some embodiments, total dam height DH may be about 1.6 millimeters. Of course, total dam height DH of dam 30 can be widely varied and is not limited to these examples. For example, total dam height DH can be more than 1.9 millimeters.

Dam 30 may be cured after every dam layer 35 of dam 30 has been deposited. In other embodiments, each dam layer 35 may be cured after it has been deposited and before another dam layer 35 is deposited. Dam curing may occur by exposure of dam 30 to a high temperature (e.g., 100° Celsius) for a prolonged period of time (e.g., 20 minutes). In some embodiments, dam 30 may include conductive jetting, one or more laser vias, or one or more grounding posts.

Once top surface 31 of the top-most dam layer 35 of dam 30 (e.g., top surface 31*a*-2 of dam layer 35*a*-2 of dam 30*a* of FIG. 4) is at least a minimum distance T above top surface 21 of the tallest electronic component 20 in circuitry region 25, pocket 45 of dam 30 may be able to hold enough fill material to submerge each electronic component 20 of circuitry region 25. For example, once total height DHa of dam 30*a* is greater than total height CHa of the tallest electronic component 20 of circuitry region 25*a* by at least minimum distance Ta, enough fill material may be deposited or otherwise applied to circuitry region 25*a* within pocket 45*a* to encapsulate or otherwise submerge circuitry region 25*a*.

As shown in FIG. 5, for example, shield 70*a* may also include an encapsulant or fill 40*a*. Once total height DHa of dam 30*a* extends above top-most surface 21*a* of circuitry region 25*a* by at least minimum distance Ta, fill 40*a* may be applied to circuitry region 25*a* within pocket 45*a*. Fill 40*a* may be any non-conductive or electrically insulating material that is suitable to at least partially fill pocket 45*a* of dam 30*a*. Fill 40*a* may be applied to circuitry region 25*a* such that top surface 41*a* of fill 40*a* may extend above circuitry region 25*a* by at least minimum distance Ta. Therefore, dam 30*a* may also extend above circuitry region 25*a* by at least minimum distance Ta such that dam 30*a* may contain fill 40*a*.

Minimum distance T may be chosen based on various factors, such as the type of fill 40 being used, the electrically conductive materials of dam 30, the types of electronic components 20 of circuitry region 25 being shielded, and the like. In some embodiments, minimum distance T may be in the range of 0.05 millimeters to 0.15 millimeters. In some embodiments, minimum distance T may be in the range of 0.07 millimeters to 0.13 millimeters. In some embodiments, minimum distance T may be about 0.10 millimeters. Of course, minimum distance T between top surface 41 of fill 40 and top surface 21 of circuitry region 25 can be widely varied and is not limited to these examples. For example, minimum distance T can be less than 0.05 millimeters.

Fill 40 may be formed of any suitable material for providing insulation to circuitry region 25 to be shielded within pocket 45. For example, encapsulant or fill 40 may be any suitable electrically insulating or non-conductive material, such as epoxy, polyurethane, acrylate, silicone chemistries, and the like. Fill 40 may be applied to circuitry region 25 within pocket 45 in any suitable way, such as by piston and barrel dispensing.

Fill 40 may be dispensed in one or more locations using one or more various fill materials. In some embodiments, a first portion of fill 40 may be dispensed underneath one or more electronic components 20 of circuitry region 25. For example, as shown in FIG. 5, an underfill portion 40*a*-1 may be deposited within pocket 45*a* under electronic component 20*a* (e.g., between bottom surface 29*a* of component 20*a* and top surface 91 of circuit board 90, about component contact regions 23*a* and board contact regions 93*a*). Underfill portion 40*a*-1 of fill 40*a* may provide stability and/or help secure electronic component 20*a* to circuit board 90. An additional fill portion 40*a*-2 may then be deposited within pocket 45*a* to complete fill 40*a*. In some embodiments, underfill portion 40*a*-1 and additional fill portion 40*a*-2 of fill 40*a* may be the same material, but may have different expansion coefficients, for example.

Fill 40 may be applied after every dam layer 35 of dam 30 has been deposited. In other embodiments, fill 40 may be deposited in various stages (e.g., a separate portion of fill 40 may be deposited before, during, or after a certain dam layer 35 of dam 30 is deposited). Moreover, fill 40 may be cured before, during, or after every dam layer 35 of dam 30 has been cured. In other embodiments, portions of fill 40 may be cured before, during, or after certain dam layers 35 of dam 30 have been cured. Fill curing may occur by exposure of fill 40 to a high temperature (e.g., 110° Celsius) for a prolonged period of time (e.g., 4 minutes). Fill 40 may be deposited up to the top of dam 30, but not much above the top of dam 30 so as to avoid overflow of fill 40 over dam 30 and outside of pocket 45.

Each shield 70 may also include a cover 50. Cover 50 may be provided above fill 40. Cover 50 may be electrically conductive and may be electrically coupled to dam 30. In some embodiments, cover 50 and dam 30 may combine to create a continuous electrically conductive Faraday cage about circuitry region 25. In some embodiments, cover 50 may fill the remainder of pocket 45 not containing fill 40. In other embodiments, cover 50 may fill only a portion of the remainder of pocket 45 above fill 40. In yet other embodiments, cover 50 may be applied on top of dam 30 (e.g., see cover 50*d* on top of top surface 31*d*-4 of dam layer 30*d*-4 of FIG. 6). For example, as shown in FIG. 6, shield 70*a* may also include a cover 50*a*. Cover 50*a* may be provided above top layer 41*a* of fill 40*a* and may be electrically coupled to dam 30*a*. Cover 50*a* may be applied on top of top layer 41*a* of fill 40*a*.

Cover 50 may be applied to shield 70 in various ways. In some embodiments, cover 50 may be a pad print. For example, a pad carrying an electrically conductive ink may be moved up and down along a vertical printing axis that may be substantially parallel to the stacking direction of each dam layer 35 above circuit board 90 (e.g., axis P of FIG. 6) to form cover 50. The pad may be made of silicone and the electrically conductive ink may be any suitable electrically conductive ink. In some embodiments, the pad may be applied to shield 70 at a high pressure, such as 300 PSI, for example.

In other embodiments, cover 50 may be a screen print. For example, a squeegee carrying an electrically conductive ink may be rubbed left and right along a horizontal printing axis that may be substantially perpendicular to the stacking direction of each dam layer 35 above circuit board 90 (e.g., axis S of FIG. 6). The squeegee pad may be moved over a mesh supporting an ink blocking stencil, such that the conductive ink may form cover 50 of an appropriate geometry above fill 40.

In yet other embodiments, cover 50 may be an electrically conductive fill, such as a melted tablet or a conductive epoxy similar to the material used for dam 30. In such embodiments, cover 50 may be melted or otherwise reconfigured from a tablet form or filled in any other manner such that cover 50 may fill or at least partially fill the remainder of pocket 45 not containing fill 40. In addition or as an alternative to an electrically conductive fill, cover 50 may include a conductive screen or sheet or layer (e.g., a metal plate or wire screen) that may be positioned in contact with dam 30 either on top of fill 40 within dam 30 or on top of dam 30 itself. In some embodiments, as shown in FIG. 6, for example, cover 50a may include a conductive fill portion 53a as well as a conductive layer 51a coupled to dam 30a. In some embodiments, cover 50 may include a force-attached film (e.g., a silver film), such as the film used in RF processes.

The geometry of cover 50 (e.g., cover thickness N, as well as its shape) may be chosen based on various factors, such as the final shape of dam 30, top surface 41 of fill 40, the electronic components 20 of circuitry region 25 being shielded, and the like. As shown in FIG. 6, for example, cover 50a may have a total cover thickness N. In some embodiments, total cover thickness N may be in the range of 0.05 millimeters to 0.15 millimeters. In some embodiments, total cover thickness N may be in the range of 0.07 millimeters to 0.13 millimeters. In some embodiments, total cover thickness N may be about 0.10 millimeters. Of course, total cover thickness N of cover 50 can be widely varied and is not limited to these examples. For example, total cover thickness N can be less than 0.05 millimeters.

Cover 50 may be cured during or after fill 40 and/or every dam layer 35 of dam 30 has been cured. Cover curing may occur by exposure of cover 50 to a high temperature (e.g., 150° Celsius) for a prolonged period of time (e.g., 10 minutes).

In some embodiments a dam of a first shield may share a portion of a dam from a second shield. For example, as shown in FIGS. 3-7, dam 30b of shield 70b may share a portion of dam 30d of shield 70d. Shield 70b may include a dam 30b that may be provided about the periphery of circuitry region 25b. Dam 30b may include at least a first dam layer 35b-1. First dam layer 35b-1 of shield 70b may be formed on top surface 91 of circuit board 90 and may circumscribe at least bottom surface 29b of electronic component 20b and bottom surface 29c of electronic component 29c. Dam 30b may be electrically coupled to common voltage contact region 95b of circuit board 90. For example, as shown in FIG. 3, first dam layer 35b-1 may be disposed on top of common voltage contact region 95b.

Likewise, as shown in FIG. 3, for example, shield 70d may include a dam 30d that may be provided about the periphery of circuitry region 25d. Dam 30d may include at least a first dam layer 35d-1. First dam layer 35d-1 of shield 70d may be formed on top surface 91 of circuit board 90 and may circumscribe at least bottom surface 29d of electronic component 20d. Dam 30d may be electrically coupled to common voltage contact region 95b of circuit board 90. For example, as shown in FIG. 3, first dam layer 35d-1 may be disposed on top of common voltage contact region 95b.

As shown in FIGS. 3-7, for example, a portion of first dam layer 35b-1 of dam 30b may be shared as a portion of first dam layer 35d-1 of dam 30d (and vice versa). Shared dam layer portion 35b-1/35d-1 may be used both by dam 30b to at least partially define pocket 45b of shield 70b as well as by dam 30d to at least partially define pocket 45d of shield 70d. In some embodiments, shared dam layer portion 35b-1/35d-1 may electrically couple both dam 30b and dam 30d to common voltage contact region 95b of circuit board 90.

Dam 30b and top surface 91 of circuit board 90 may combine to define space or pocket 45b about each electronic component 20 of circuitry region 25b (i.e., electronic components 20b and 20c). Dam 30b may include only first dam layer 35b-1 or a stack of two or more dam layers 35b to define pocket 45b. Like dam 30a, dam 30b may be sized such that pocket 45b is able to hold enough fill material to submerge each electronic component 20 of circuitry region 25b within pocket 45b.

Once top surface 31b-1 of the top-most dam layer 35b-1 of dam 30b is at least a minimum distance Tb above top surface 21c of the tallest electronic component 20 in circuitry region 25b (e.g. component 20c), pocket 45b of dam 30b may be able to hold enough fill material to submerge each electronic component 20 of circuitry region 25b. For example, as shown in FIG. 4, once total height DHb of dam 30b is greater than total height CHb of the tallest electronic component 20 of circuitry region 25b (e.g., electronic component 20c) by at least minimum distance Tb, enough fill material 40b may be deposited or otherwise applied to circuitry region 25b within pocket 45b to encapsulate or otherwise submerge circuitry region 25b.

As shown in FIG. 4, for example, shield 70b may also include an encapsulant or fill 40b. Once total height DHb of dam 30b extends above top-most surface 21b of circuitry region 25b by at least minimum distance Tb, fill 40b may be applied to circuitry region 25b within pocket 45b. Fill 40b may be any non-conductive or electrically insulating material that is suitable to at least partially fill pocket 45b of dam 30b. Fill 40b may be applied to circuitry region 25b such that top surface 41b of fill 40b extends above circuitry region 25b by at least minimum distance Tb. Therefore, dam 30b may also extend above circuitry region 25b by at least minimum distance Tb such that dam 30b may contain fill 40b.

As shown in FIG. 5, for example, shield 70b may also include a cover 50b. Cover 50b may be provided above top layer 41b of fill 40b and may be electrically coupled to dam 30b. Cover 50b may be applied on top of top layer 41b of fill 40b. In some embodiments, cover 50b may be applied on top of top surface 31b-1 of top-most layer 35b-1 of dam 30b).

Dam 30d and top surface 91 of circuit board 90 may combine to define space or pocket 45d about each electronic component 20 of circuitry region 25d (i.e., electronic component 20d). Dam 30d may include only first dam layer 35d-1 or a stack of two or more dam layers 35d to define pocket 45d. Dam 30d may be sized such that pocket 45d is able to hold enough fill material to submerge each electronic component 20 of circuitry region 25d within pocket 45d. The volume of pocket 45d may be at least partially based on the height of dam 30d, and thus on the number of dam layers 35d included in dam 30d.

In some embodiments, dam 30d of shield 70d may include at least one additional layer 35d. Each additional dam layer 35d may be applied about the periphery of circuitry region 25d. As shown in FIG. 5, for example, a second dam layer 35d-2 of dam 30d may be provided on top surface 31d-1 of first dam layer 35d-1 and may circumscribe at least a portion of electronic component 20d. Even more additional dam layers 35d-3 and 35d-4 may be added to dam 30d as needed.

Once top surface 31d-4 of top-most dam layer 35d-4 of dam 30d is at least a minimum distance Td above top surface 21d of the tallest electronic component 20 in circuitry region 25d (e.g., component 20d), pocket 45d of dam 30d may be able to hold enough fill material to submerge each electronic component 20 of circuitry region 25d. For example, once total height DHd of dam 30d is greater than total height CHd of the tallest electronic component 20 of circuitry region 25d by at least minimum distance Td, enough fill material may be deposited or otherwise applied to circuitry region 25d within pocket 45d to encapsulate or otherwise submerge circuitry region 25d.

As shown in FIG. 5, for example, shield 70d may also include an encapsulant or fill 40d. Once total height DHd of dam 30d extends above top-most surface 21d of circuitry region 25d by at least minimum distance Td, fill 40d may be applied to circuitry region 25d within pocket 45d. Fill 40d may be any non-conductive or electrically insulating material that is suitable to at least partially fill pocket 45d of dam 30d. Fill 40d may be applied to circuitry region 25d such that top surface 41d of fill 40d extends above circuitry region 25d by at least minimum distance Td. Therefore, dam 30d may also extend above circuitry region 25d by at least minimum distance Td such that dam 30d may contain fill 40d.

As shown in FIG. 6, for example, shield 70d may also include a cover 50d. Cover 50d may be provided above top layer 41d of fill 40d and may be electrically coupled to dam 30d. Cover 50d may be applied on top of top surface 31d-4 of the top-most dam layer 35d-4 of dam 30d. In some embodiments, dam 30 and/or cover 50 may be provided with one or more mechanical features (e.g., groove/tongue combinations, etc.) to help couple the dam to the fill. For example, at least one groove may be formed in a portion of dam 30 or cover 50 and at least one respective tongue may be formed in the other one of dam 30 and cover 50. As shown in FIG. 6, for example, shield 70 may include at least one groove 37d provided along a surface of dam 30d and at least one tongue 57d provided along a surface of cover 50d. Groove 37d and tongue 57d may mate or otherwise interlock for securing the coupling of dam 30d and cover 50d, for example.

Dam 30b may be cured before, during, or after dam 30d has been cured or deposited. Fill 40b may be applied to shield 70b after every dam layer 35b of dam 30b has been deposited (e.g., sole dam layer 35b-1). In other embodiments, fill 40b may be deposited along with fill 40d after every dam layer 35d of dam 30d has been deposited. Moreover, fill 40b may be cured before, during, or after fill 40d. In other embodiments, portions of fill 40b may be cured before, during, or after certain portions of fill 40d. Likewise, cover 50b may be applied to shield 70b before, during, or after cover 50d is applied to shield 70d. Moreover, cover 50b may be cured before, during, or after cover 50d.

Figure 7:
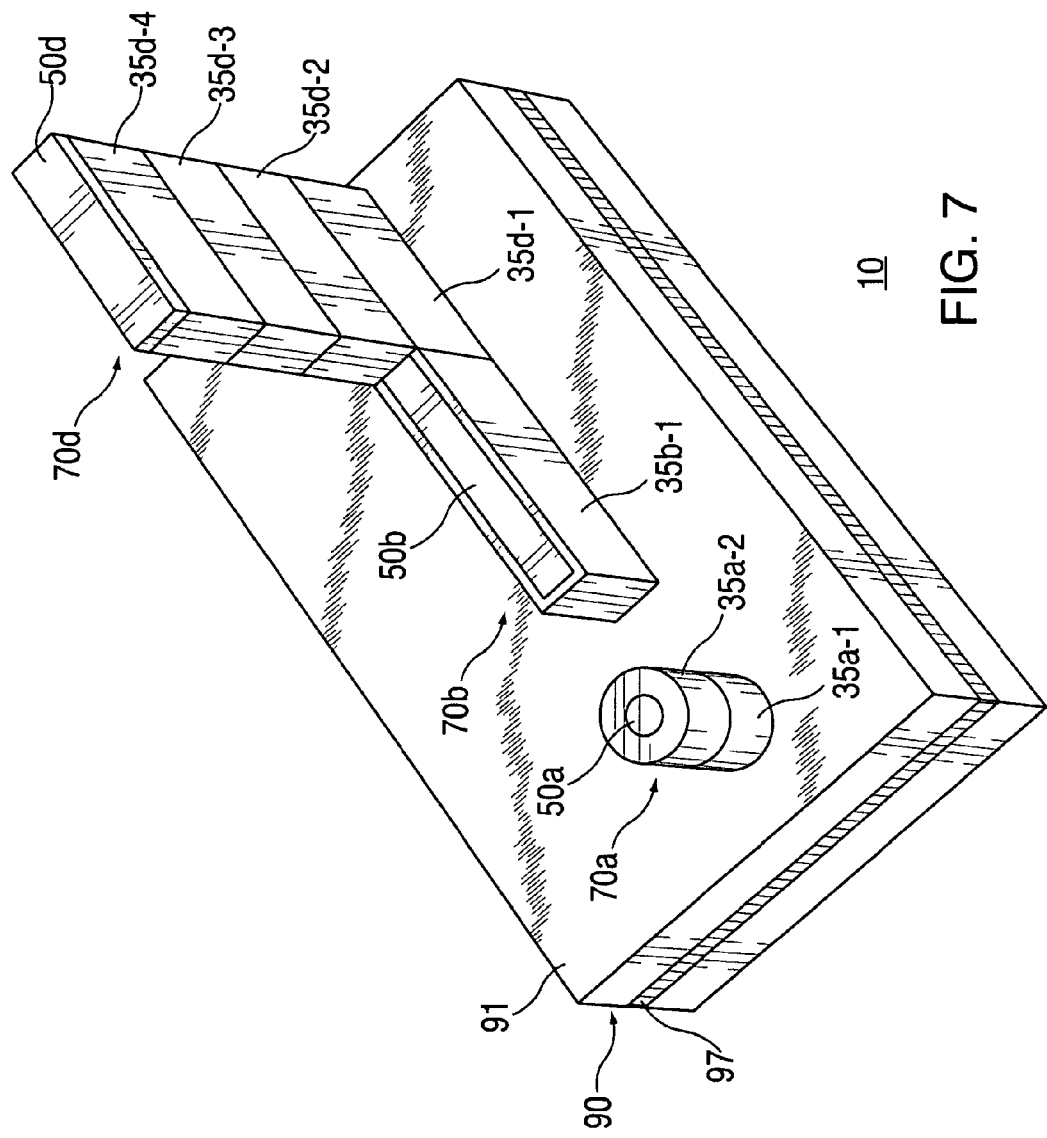
FIG. 7 is a top, front, left perspective view, similar to FIG. 1, of the portion of the electronic device of FIGS. 1-6, at the stage of manufacture of FIG. 6, in accordance with some embodiments of the invention.

The size and shape of each shield 70 may vary based on various factors, such as the electrically conductive materials of dam layers 35 and cover 50, the size and shape of electronic components 20 of circuitry region 25 being shielded, the insulation properties of fill 40, and the like. For example, as shown in FIG. 7, the shape of shield 70a formed by dam 30a, cover 50a, and a portion of circuit board 90 may be substantially cylindrical, while shield 70d formed by dam 30d, cover 50d, and a portion of circuit board 90 may be substantially hexahedral.

Figure 8:
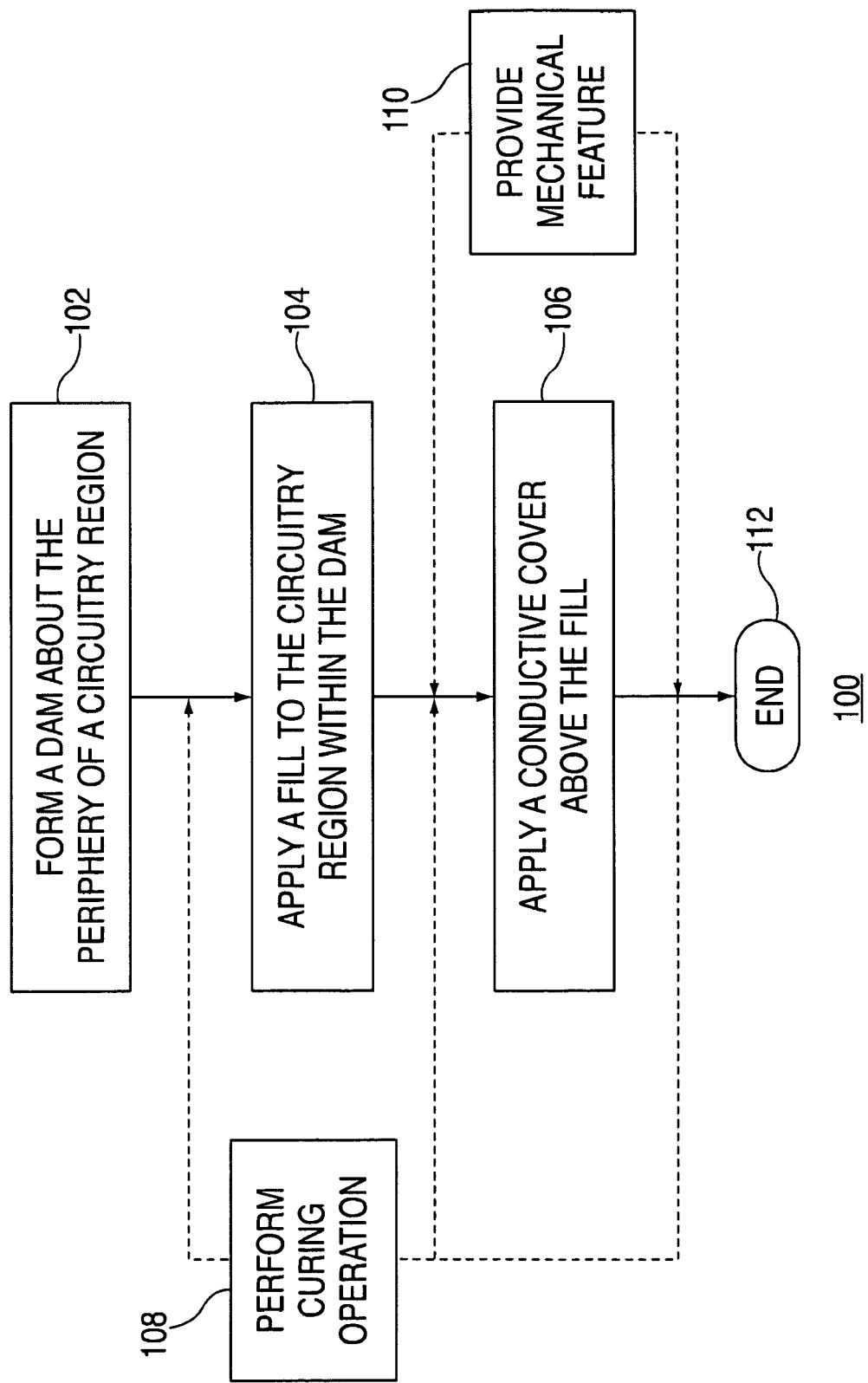
FIG. 8 is a flowchart of an illustrative process for manufacturing shielding for a circuitry region, in accordance with some embodiments of the invention.

FIG. 8 is a flowchart of an illustrative process 100 for manufacturing a shield assembly.

Process 100 may include step 102 where a dam may be formed about the periphery of a circuitry region. In some embodiments, the circuitry region may be coupled to a top surface of a circuit board, and the dam may be formed on the top surface of the circuit board about the circuitry region. The dam may include a single dam layer or multiple dam layers stacked on top of one another. Each dam layer may be a conductive material, such as a conductive epoxy.

Process 100 may also include step 104 where a fill may be applied to the circuitry region within the dam. The fill may be any suitable non-conductive or electrically insulating material. Multiple fill portions may be applied to the circuitry region at step 104. For example, a first fill portion may be applied as an underfill portion. If multiple dam layers are formed at step 102, then multiple fill portions may be applied at step 104 between the successive formations of various dam layers at step 102.

Process 100 may also include step 106 where an electrically conductive cover may be applied above the fill. The application of a conductive cover at step 106 may also include electrically coupling the cover to the dam. Any suitable process, such as pad printing, screen printing, melting a conductive tablet, laying a conductive screen or sheet, and combinations thereof, may be performed to apply a conductive cover above the fill.

In some embodiments, process 100 may also include step 108 where an optional curing operation may be performed on one or more layers of the dam formed at step 102, on the fill applied at step 104, and/or on the conductive cover applied at step 106. Each one of the dam, fill, and cover may be cured at once or individually. A curing operation of step 108 may be performed after the formation of each or every dam layer formed at step 102, after the application of the fill at step 104, or after the application of the cover at step 106.

In some embodiments, process 100 may also include step 110 where optional mechanical features may be provided on at least one of the dam and cover to help couple the dam to the fill. For example, at least one groove may be formed in a portion of the dam or cover and at least one respective tongue may be formed in the other one of the dam and cover at step 110, such that step 106 of applying the cover may include interlocking the tongue and the groove. Process 100 can then end at step 112.

It is understood that the steps shown in FIG. 8 are merely illustrative and that existing steps may be modified, added, or omitted.

While there have been described methods and apparatus for shielding circuitry from interference, it is to be understood that many changes may be made therein without departing from the spirit and scope of the invention. It is also to be understood that various directional and orientational terms such as "up" and "down," "left" and "right," "top" and "bottom," and the like are used herein only for convenience, and that no fixed or absolute directional or orientational limitations are intended by the use of these words. For example, the devices of the invention can have any desired orientation. If reoriented, different directional or orientational terms may need to be used in their description, but that will not alter their fundamental nature as within the scope and spirit of the invention. Those skilled in the art will appreciate that the invention can be practiced by other than the described embodiments, which are presented for purposes of illustration rather than of limitation, and the invention is limited only by the claims which follow.

What is claimed is:

1. Apparatus comprising:
   a circuit board;
   a conductive dam on a top surface of the circuit board that surrounds a circuitry region, wherein the conductive dam has a first mechanical feature;
   an electrically insulating fill covering the circuitry region within the conductive dam;
   a conductive cover having a second mechanical feature positioned above the electrically insulating fill and electrically coupled to the conductive dam, wherein the first mechanical feature of the conductive dam is configured to mate with the second mechanical feature of the conductive cover and wherein the circuitry region comprises a first circuitry region and wherein the conductive dam comprises a first conductive dam; and a second conductive dam on the top surface of the circuit board about a second circuitry region, wherein a portion of the first conductive dam is shared with the second conductive dam.

2. The apparatus of claim 1 further comprising:
at least one electronic component in the circuitry region, wherein the electrically insulating fill submerges the at least one electronic component.

3. The apparatus of claim 1, wherein the conductive dam comprises a layer of conductive epoxy on the top surface of the circuit board about the circuitry region.

4. The apparatus of claim 3, wherein the conductive dam further comprises at least one additional layer of the conductive epoxy on top of the layer of the conductive epoxy.

5. The apparatus of claim 1, wherein the conductive cover comprises at least one of a pad print, a screen print, a conductive fill, and a screen.

6. The apparatus of claim 1 wherein the electrically insulating fill comprises a first electrically insulating fill, the apparatus further comprising:
a second electrically insulating fill covering the second circuitry region within the second conductive dam.

7. The apparatus of claim 1, wherein:
the first electrically insulating fill extends to a first height above the top surface of the circuit board;
the second electrically insulating fill extends to a second height above the top surface of the circuit board; and
the first height is greater than the second height.

8. The apparatus of claim 1, wherein:
the first mechanical feature of the conductive dam comprises a groove; and
the second mechanical feature of the conductive cover comprises a tongue.

9. The apparatus of claim 1, wherein:
the conductive dam comprises a conductive epoxy; and
the conductive cover comprises the conductive epoxy.

10. The apparatus of claim 1, wherein:
the conductive dam comprises a conductive epoxy; and
the electrically insulating fill is less viscous than the conductive epoxy.

11. The apparatus of claim 1, wherein the conductive dam and the conductive cover combine to create a continuous electrically conductive Faraday cage about the circuitry region.

12. The apparatus defined in claim 1 wherein a gap separates the electrically insulating fill and the conductive cover.

13. The apparatus defined in claim 1 wherein the conductive cover comprises a metal plate having the second mechanical feature.

14. Apparatus comprising:
a circuit board;
a conductive dam on the top surface of the circuit board that surrounds a circuitry region;
an electrically insulating fill inside at least a first portion of a pocket defined between the top surface of the circuit board, the conductive dam, and the circuitry region; and
a conductive lid above the electrically insulating fill, wherein a first portion of the conductive lid comprises a first material inside at least a second portion of the pocket, and wherein a second portion of the conductive lid comprises a second material positioned at the top of the conductive dam.

15. The apparatus of claim 14, wherein the conductive lid is electrically coupled to the conductive dam.

16. The apparatus of claim 14, wherein the conductive dam and the conductive lid combine to create a continuous electrically conductive Faraday cage about the circuitry region.

17. The apparatus of claim 14, wherein the at least the first portion of the conductive lid fills the remainder of the pocket not filled by the electrically insulating fill.

18. The apparatus of claim 14, wherein:
the circuitry region comprises at least one electronic component; and
the electrically insulating fill submerges the at least one electronic component.

19. The apparatus of claim 14, wherein the conductive lid comprises at least one of a pad print, a screen print, a conductive fill, and a screen.

20. Apparatus comprising:
a circuit board;
a conductive dam on the top surface of the circuit board that surrounds a circuitry region;
an electrically insulating fill inside at least a first portion of a pocket defined between the top surface of the circuit board, the conductive dam, and the circuitry region; and
a conductive lid above the electrically insulating fill, wherein a first portion of the conductive lid is inside at least a second portion of the pocket, and wherein a second portion of the conductive lid is positioned on the top of the conductive dam, wherein:
the first portion of the conductive lid comprises a conductive fill; and
the second portion of the conductive lid comprises a conductive layer.

21. Apparatus comprising:
a circuit board;
a conductive dam on the top surface of the circuit board that surrounds a circuitry region;
an electrically insulating fill inside at least a first portion of a pocket defined between the top surface of the circuit board, the conductive dam, and the circuitry region; and
a conductive lid above the electrically insulating fill, wherein a first portion of the conductive lid is inside at least a second portion of the pocket, and wherein a second portion of the conductive lid is positioned on the top of the conductive dam, wherein:
the first portion of the conductive lid comprises a conductive epoxy; and
the second portion of the conductive lid comprises a force-attached film.

22. The apparatus of claim 21, wherein the conductive dam comprises at least one layer made of the conductive epoxy.

* * * * *